United States Patent
Tsai et al.

(10) Patent No.: US 12,532,745 B2
(45) Date of Patent: Jan. 20, 2026

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Wen-Jung Tsai, Taichung (TW); Chih-Hsien Chiu, Taichung (TW); Chien-Cheng Lin, Taichung (TW); Ming-Fan Tsai, Taichung (TW); Cheng-You Jeng, Taichung (TW); Hui-Jing Chang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 408 days.

(21) Appl. No.: 18/334,434

(22) Filed: Jun. 14, 2023

(65) Prior Publication Data

US 2024/0290728 A1 Aug. 29, 2024

(30) Foreign Application Priority Data

Feb. 24, 2023 (TW) .................................. 112107091

(51) Int. Cl.
*H01L 23/552* (2006.01)
*H01L 23/00* (2006.01)
*H01L 23/498* (2006.01)

(52) U.S. Cl.
CPC ...... *H01L 23/552* (2013.01); *H01L 23/49816* (2013.01); *H01L 24/16* (2013.01); *H01L 24/32* (2013.01); *H01L 24/73* (2013.01); *H01L 2224/16225* (2013.01); *H01L 2224/73204* (2013.01); *H01L 2924/3025* (2013.01)

(58) Field of Classification Search
CPC ...................... H01L 23/552; H01L 2924/3025
See application file for complete search history.

(56) References Cited

U.S. PATENT DOCUMENTS

| | | | | |
|---|---|---|---|---|
| 5,639,989 | A * | 6/1997 | Higgins, III | H01L 23/552 174/394 |
| 6,350,951 | B1 * | 2/2002 | Askew | H01L 23/60 257/659 |
| 9,461,001 | B1 * | 10/2016 | Tsai | H01L 25/0655 |
| 12,362,287 | B2 * | 7/2025 | Kim | H01L 25/16 |
| 2016/0172580 | A1 * | 6/2016 | Matsubara | H01L 24/19 257/422 |
| 2021/0407927 | A1 * | 12/2021 | Salmon | H01L 24/16 |

* cited by examiner

*Primary Examiner* — Errol V Fernandes
(74) *Attorney, Agent, or Firm* — Dority & Manning, PA

(57) ABSTRACT

An electronic package and a manufacturing method thereof are provided, in which a cover is disposed on a carrier structure having an electronic element, and the electronic element is covered by the cover. A magnetic conductive member is arranged between the cover and the electronic element, and an air gap is formed between the magnetic conductive member and the cover to enhance the shielding effect of the electronic package.

18 Claims, 4 Drawing Sheets

ELECTRONIC PACKAGE AND MANUFACTURING METHOD THEREOF

BACKGROUND

1. Technical Field

The present disclosure relates to a semiconductor packaging process, and more particularly, to an electronic package with shielding mechanism and a manufacturing method thereof.

2. Description of Related Art

With the evolution of semiconductor technology, in order to improve the electrical quality, most semiconductor products have shielding functions to prevent electromagnetic interference (EMI).

As shown in FIG. 1, in a manufacturing method of a conventional semiconductor package 1, a semiconductor chip 11 is disposed on a packaging substrate 10 via an active surface 11a of the semiconductor chip 11 in a flip-chip manner (i.e., via conductive bumps 110 and an underfill 111), and an adhesive layer 14 is formed on the packaging substrate 10. Then, a copper cover 13 (e.g., a copper cover member) covers an inactive surface 11b of the semiconductor chip 11 via a top sheet 130 of the copper cover 13, and supporting legs 131 of the copper cover 13 are mounted on the packaging substrate 10 via the adhesive layer 14.

During operation, the shielding function is provided by the copper cover 13 to prevent electromagnetic interference to the signal transmission and reception of the semiconductor chip 11.

As product applications change, many chips need memory components, such as a magneto-resistive chip of a magneto-resistive random access memory (MRAM), that can read and write rapidly, consume less power, and will not lose data after power failure. MRAM has the advantages of non-volatility of flash memory, the capacity density and service life not inferior to DRAM, and average energy consumption much lower than that of DRAM. Thus, the demand for the semiconductor chip 11 to adopt a magneto-resistive chip has been regarded as the mainstream of the next generation general-purpose memory.

However, in the conventional semiconductor package 1, if the shielding function is provided by the copper cover 13 only, the semiconductor chip 11 with MRAM specification is still prone to the interference of magnetic field, resulting in function failure. For instance, a conventional high-conductivity metal shielding member (i.e., the copper cover 13) has very poor shielding effect on magnetic field, and the shielding performance of the conventional high-conductivity metal shielding member is less than −10 dB (i.e., less than 90% of the magnetic field is shielded) under low frequency conditions.

Moreover, although the industry has developed a layer of magnetic conductive material on the inner side of the metal cover, such as Patent No. TW 1786082, to strengthen the shielding effect of the metal shielding member, but the shielding performance still cannot achieve the practical requirement of at least −15 dB (i.e., at least 97% of the magnetic field is shielded) under low frequency conditions.

Therefore, how to overcome the problems of the above-mentioned prior art has become an urgent problem to be solved at present.

SUMMARY

In view of the aforementioned shortcomings of the prior art, the present disclosure provides an electronic package, which comprises: a carrier structure; an electronic element disposed on the carrier structure; a cover disposed on the carrier structure and covering the electronic element; and a magnetic conductive member disposed between the cover and the electronic element, wherein the magnetic conductive member and the cover are formed with an air gap therebetween.

The present disclosure also provides a method of manufacturing an electronic package, the method comprises: disposing an electronic element on a carrier structure; disposing a magnetic conductive member on the electronic element, wherein the electronic element is covered by the magnetic conductive member; and disposing a cover on the carrier structure, wherein the magnetic conductive member is covered by the cover, and an air gap is formed between the magnetic conductive member and the cover.

In the aforementioned method, the magnetic conductive member is bonded onto the electronic element via a bonding material.

The present disclosure further provides a method of manufacturing an electronic package, the method comprises: disposing an electronic element on a carrier structure; bonding a magnetic conductive member onto a cover via a bonding material, and an air gap being formed in the bonding material; and disposing a cover on the carrier structure, wherein the electronic element is covered by the cover, and the magnetic conductive member is positioned between the cover and the electronic element.

In the aforementioned electronic package and two methods, the cover is an iron cover.

In the aforementioned electronic package and two methods, the cover comprises a sheet and supporting legs erected on the sheet, wherein the air gap is formed between the sheet and the magnetic conductive member, and the supporting legs are bonded onto the carrier structure.

In the aforementioned electronic package and two methods, the magnetic conductive member is ferrite.

In the aforementioned electronic package and two methods, the present disclosure further comprises forming a surface treatment layer on the cover.

It can be seen from the above that in the electronic package of the present disclosure and the manufacturing method thereof, an air gap is formed between the magnetic conductive member and the cover to strengthen the shielding effect. Therefore, compared with the prior art, when the electronic package is operated under low frequency conditions, the shielding performance of the shielding structure can be greater than −15 dB (i.e., at least 97% of the magnetic field is shielded) to meet the practical requirements.

DETAILED DESCRIPTION

The following describes the implementation of the present disclosure with examples. Those skilled in the art can easily understand other advantages and effects of the present disclosure from the content disclosed in this specification.

It should be understood that, the structures, ratios, sizes, and the like in the accompanying figures are used for illustrative purposes to facilitate the perusal and comprehension of the content disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical content disclosed in the present specification. Meanwhile, terms such as "on," "below," "one," "a," and the like used herein are merely used for clear explanation rather than limiting the practicable scope of the present disclosure, and thus, alterations or adjustments of the relative relationships thereof without essentially altering the technical content should still be considered in the practicable scope of the present disclosure.

Figure 1:
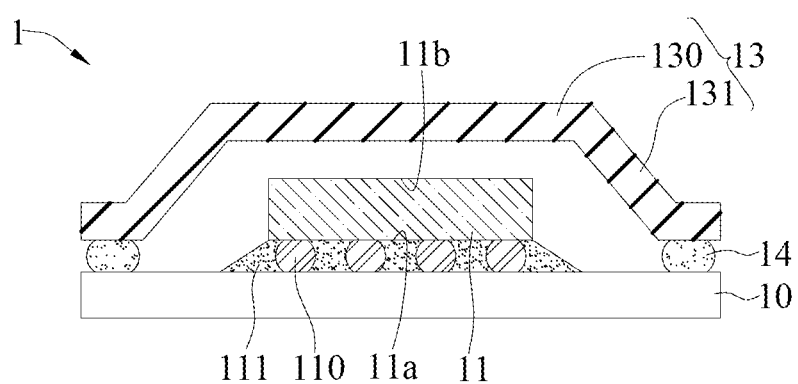
FIG. 1 is a schematic cross-sectional view showing a conventional semiconductor package.
Figure 2A:
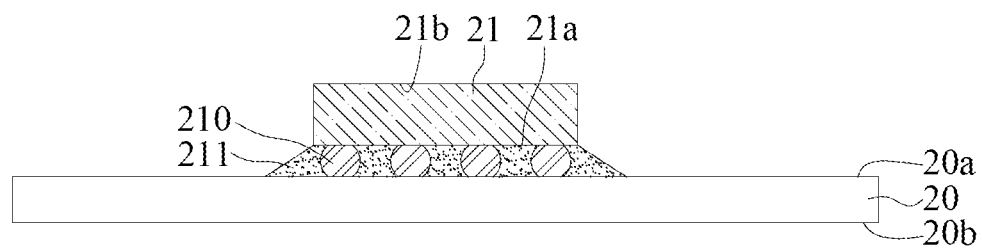
FIG. 2A to FIG. 2C are schematic cross-sectional views illustrating a manufacturing method of an electronic package according to a first embodiment of the present disclosure.
Figure 2B:
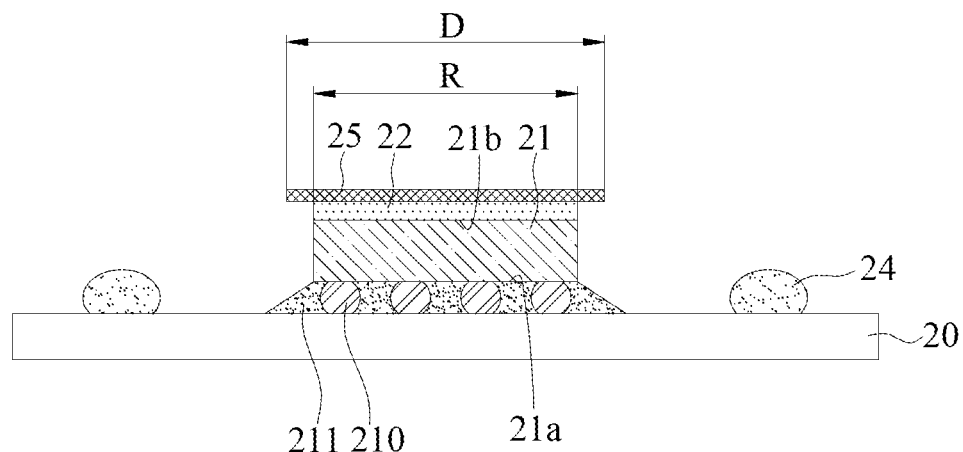
Figure 2C:
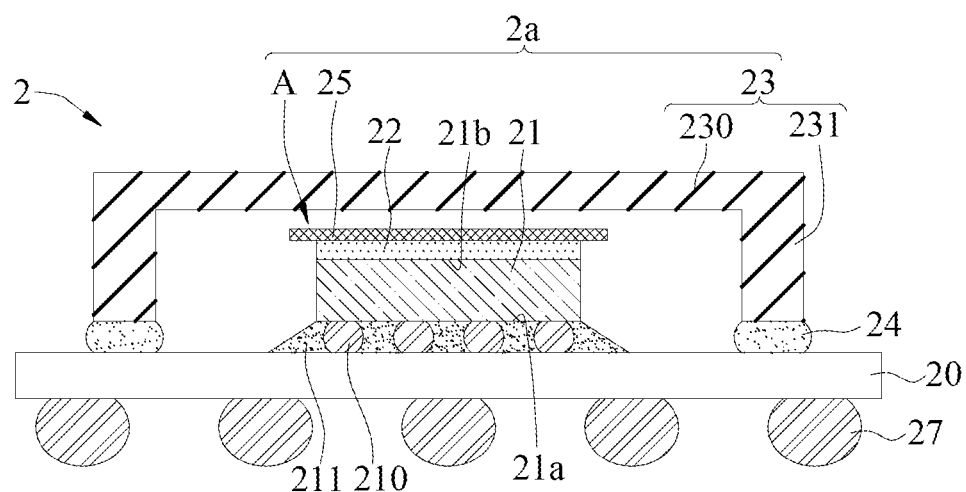

FIG. 2A to FIG. 2C are schematic cross-sectional views illustrating a manufacturing method of an electronic package 2 according to a first embodiment of the present disclosure.

As shown in FIG. 2A, a carrier structure 20 is provided and has a first side 20a and a second side 20b opposing the first side 20a, and at least one electronic element 21 is disposed on the first side 20a of the carrier structure 20.

In an embodiment, the carrier structure 20 is for example a packaging substrate with a core layer and a circuit structure, a packaging substrate with a coreless circuit structure, a through-silicon interposer (TSI) with through-silicon vias (TSVs), or other board types. The carrier structure 20 comprises at least one insulating layer and at least one circuit layer (such as at least one fan-out redistribution layer [RDL]) bonded to the insulating layer. It can be understood that the carrier structure 20 can also be other plates such as a lead frame, a wafer for carrying chips, or other plates with metal routings, but the present disclosure is not limited to as such.

In addition, the electronic element 21 is an active element, a passive element, a semiconductor element having through-silicon vias (TSVs), a chip module, or a combination thereof, wherein the active element is such as a semiconductor chip, and the passive element is such as a resistor, a capacitor, or an inductor. In an embodiment, the electronic element 21 is a semiconductor chip such as a magneto-resistive random access memory (MRAM) and has an active surface 21a and an inactive surface 21b opposing the active surface 21a. The active surface 21a is disposed on the circuit layer of the carrier structure 20 via a plurality of conductive bumps 210 such as solder material, metal pillars, or the like in a flip-chip manner, and the active surface 21a is electrically connected to the circuit layer, and an underfill 211 is formed between the carrier structure 20 and the active surface 21a to cover each of the conductive bumps 210. Alternatively, the electronic element 21 can be electrically connected to the circuit layer of the carrier structure 20 via a plurality of bonding wires (not shown) in a wire-bonding manner; even the electronic element 21 can directly contact the circuit layer of the carrier structure 20. It can be understood that there are various ways to electrically connect the electronic element 21 to the carrier structure 20, and the required types and quantities of electronic elements can be placed on the carrier structure 20, but the present disclosure is not limited to as such.

As shown in FIG. 2B, a magnetic conductive member 25 is bonded onto the inactive surface 21b of the electronic element 21, such that the magnetic conductive member 25 covers the electronic element 21.

In an embodiment, the magnetic conductive member 25 has high magnetic permeability, such as ferrite, and is formed on the inactive surface 21b of the electronic element 21 via a bonding material 22.

Moreover, the bonding material 22 can have a high thermal conductivity of about 30-80 W/m·K so as to be used as a thermal interface material (TIM). For instance, the bonding material 22 is made of silicon glue material, ultraviolet (UV) glue material, or other thermosetting materials. It can be understood that there are various kinds of bonding materials, and the present disclosure is not limited to as such.

Furthermore, a width D of the magnetic conductive member 25 is greater than or equal to a width R of the electronic element 21, such that the magnetic conductive member 25 completely covers the electronic element 21.

As shown in FIG. 2C, a cover 23 (e.g., a cover member) is bonded onto the first side 20a of the carrier structure 20, and the cover 23 covers the magnetic conductive member 25, so that an air gap A is formed between the magnetic conductive member 25 and the cover 23.

In an embodiment, the cover 23 is in a cover shape and comprises a sheet 230 (e.g., a sheet body) and a plurality of supporting legs 231 erected/disposed on the sheet 230, such that the air gap A is formed between the sheet 230 and the magnetic conductive member 25, and the supporting legs 231 are bonded onto the carrier structure 20 via an adhesive layer 24. For instance, the cover 23 is a metal cover such as an iron cover, and the adhesive layer 24 is made of a thermosetting glue material such as solder material, so that the supporting legs 231 are adhered on the carrier structure 20, then the adhesive layer 24 is baked. It can be understood that there are various kinds of the adhesive layer 24, and the present disclosure is not limited to as such.

Additionally, the adhesive layer 24 can be formed on the carrier structure 20 first, as shown in FIG. 2B, and then the supporting legs 231 are bonded to the adhesive layer 24. Alternatively, the adhesive layer 24 can be formed on the supporting legs 231 first, and then the supporting legs 231 are formed on the carrier structure 20 via the adhesive layer 24 thereon. It can be understood that there are various arrangements of the cover 23, and the present disclosure is not limited to as such.

Furthermore, in a subsequent process, a plurality of conductive elements 27 such as solder balls can be arranged on the second side 20b of the carrier structure 20, and a singulation process is performed, so that the electronic package 2 is bonded to an electronic device (not shown) such as a circuit board via the plurality of conductive elements 27.

Therefore, in the manufacturing method of the electronic package 2 according to the first embodiment of the present disclosure, the air gap A is formed between the magnetic conductive member 25 and the cover 23, so that the magnetic conductive member 25, the cover 23 and the air gap A act as a shielding structure 2a to strengthen the shielding effect. Hence, compared with the prior art, when the electronic package 2 is operated under low frequency conditions, the shielding performance of the shielding structure 2a is greater than or equal to −15 dB (i.e., at least 97% of the magnetic field is shielded) and can even reach −20 dB (i.e., at least 99% of the magnetic field is shielded) so as to meet the practical requirements.

Figure 3A:
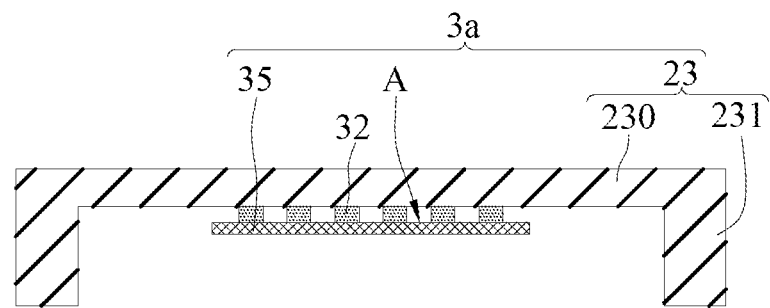
FIG. 3A to FIG. 3B are schematic cross-sectional views illustrating a manufacturing method of an electronic package according to a second embodiment of the present disclosure.
Figure 3B:
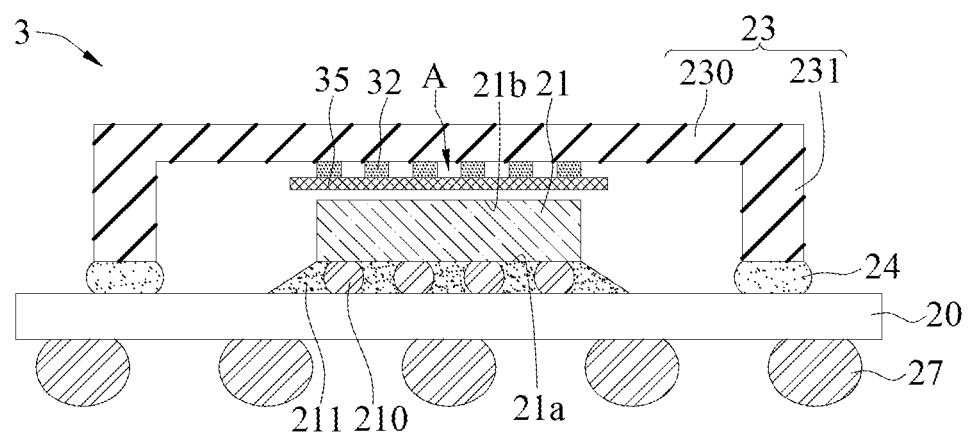

FIG. 3A to FIG. 3B are schematic cross-sectional views illustrating a manufacturing method of an electronic package 3 according to a second embodiment of the present disclosure. The difference between the second embodiment and the first embodiment lies in the position of the magnetic conductive member 25, and other processes are substantially the same, so the similarities will not be repeated below.

As shown in FIG. 3A, subsequent to the process shown in FIG. 2A, a magnetic conductive member 35 is bonded onto the cover 23 via a bonding material 32, and at least one air gap A is formed in the bonding material 32, so that the air gap A is formed between the magnetic conductive member 35 and the cover 23.

In an embodiment, the bonding material 32 is formed on the sheet 230 by patterning, and then the magnetic conductive member 35 is bonded onto the bonding material 32, so that the air gap A is formed between the sheet 230 and the magnetic conductive member 35. For instance, the bonding material 32 is formed by dispensing glue or other methods.

Moreover, the bonding material 32 can be a fixing glue material, which is different from the bonding material 22 of the first embodiment. It can be understood that the patterned bonding material 32 can also be adopted in the first embodiment, so that an air gap is formed between the magnetic conductive member 25 and the electronic element 21.

As shown in FIG. 3B, the cover 23 is bonded onto the first side 20a of the carrier structure 20, such that the magnetic conductive member 35 covers the electronic element 21.

In an embodiment, in a subsequent process, the plurality of conductive elements 27 such as solder balls can be arranged on the second side 20b of the carrier structure 20, and a singulation process is performed, so that the electronic package 2 is bonded onto an electronic device (not shown) such as a circuit board via the plurality of conductive elements 27.

Therefore, in the manufacturing method of the electronic package 3 according to the second embodiment of the present disclosure, a plurality of air gaps A are formed in the bonding material 32, so that the plurality of air gaps A are formed between the magnetic conductive member 35 and the cover 23, such that the magnetic conductive member 35, the cover 23 and the air gaps A act as a shielding structure 3a to strengthen the shielding effect. Hence, compared with the prior art, when the electronic package 3 is operated under low frequency conditions, the shielding performance of the shielding structure 3a is greater than or equal to −15 dB (i.e., at least 97% of the magnetic field is shielded) and can even reach −20 dB (i.e., at least 99% of the magnetic field is shielded) so as to meet the practical requirements.

Figure 4:
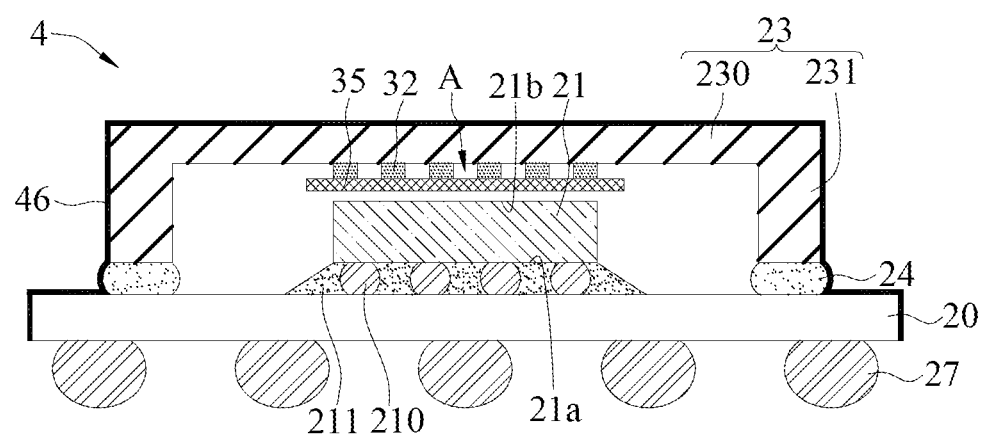
FIG. 4 is a schematic cross-sectional view showing a subsequent process of FIG. 3B.

In addition, in the subsequent process of the manufacturing methods of the aforementioned first embodiment and second embodiment, a surface treatment layer 46 can be formed on the surface of the cover 23. For example, an electronic package 4 shown in FIG. 4 is a continuation of the second embodiment and can prevent the cover 23 from being oxidized. For instance, the surface treatment layer 46 is a metal layer formed by electroplating or other methods to further provide the shielding function.

The present disclosure also provides an electronic package 2, 3, 4, which comprises: a carrier structure 20, at least one electronic element 21 disposed on the carrier structure 20, a cover 23, and a magnetic conductive member 25.

The cover 23 is disposed on the carrier structure 20 to cover the electronic element 21.

The magnetic conductive member 25 is disposed between the cover 23 and the electronic element 21, and an air gap A is formed between the magnetic conductive member 25 and the cover 23.

In an embodiment, the cover 23 is an iron cover.

In an embodiment, the cover 23 comprises a sheet 230 and at least one supporting leg 231 erected on the sheet 230, such that the air gap A is formed between the sheet 230 and the magnetic conductive member 25, and the supporting leg 231 is bonded onto the carrier structure 20.

In an embodiment, the magnetic conductive member 25 is ferrite.

In an embodiment, the magnetic conductive member 25 is bonded onto the electronic element 21 via a bonding material 22.

In an embodiment, the magnetic conductive member 25 is bonded onto the cover 23 via a bonding material 32, and the air gap A is formed in the bonding material 32.

In an embodiment, the electronic package 4 further comprises a surface treatment layer 46 formed on the cover 23.

To sum up, in the electronic package of the present disclosure and manufacturing method thereof, an air gap is formed between the magnetic conductive member and the cover to strengthen the shielding effect of the shielding structure. Therefore, when the electronic package is operated under low frequency conditions, the shielding performance of the shielding structure can meet the practical requirements.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
   a carrier structure;
   an electronic element disposed on the carrier structure;
   a cover disposed on the carrier structure and covering the electronic element; and
   a magnetic conductive member disposed between the cover and the electronic element, wherein the magnetic conductive member and the cover are formed with an air gap therebetween.

2. The electronic package of claim 1, wherein the cover is an iron cover.

3. The electronic package of claim 1, wherein the cover comprises a sheet and supporting legs erected on the sheet, wherein the air gap is formed between the sheet and the magnetic conductive member, and the supporting legs are bonded onto the carrier structure.

4. The electronic package of claim 1, wherein the magnetic conductive member is ferrite.

5. The electronic package of claim 1, wherein the magnetic conductive member is bonded onto the electronic element via a bonding material.

6. The electronic package of claim 1, wherein the magnetic conductive member is bonded onto the cover via a bonding material, and the air gap is formed in the bonding material.

7. The electronic package of claim 1, further comprising a surface treatment layer formed on the cover.

8. A method of manufacturing an electronic package, comprising:
   disposing an electronic element on a carrier structure;
   disposing a magnetic conductive member on the electronic element, wherein the electronic element is covered by the magnetic conductive member; and
   disposing a cover on the carrier structure, wherein the magnetic conductive member is covered by the cover, and an air gap is formed between the magnetic conductive member and the cover.

9. The method of claim 8, wherein the magnetic conductive member is bonded onto the electronic element via a bonding material.

10. The method of claim 8, wherein the cover is an iron cover.

11. The method of claim 8, wherein the cover comprises a sheet and supporting legs erected on the sheet, wherein the air gap is formed between the sheet and the magnetic conductive member, and the supporting legs are bonded onto the carrier structure.

12. The method of claim 8, wherein the magnetic conductive member is ferrite.

13. The method of claim 8, further comprising forming a surface treatment layer on the cover.

14. A method of manufacturing an electronic package, comprising:

disposing an electronic element on a carrier structure;

bonding a magnetic conductive member onto a cover via a bonding material, and an air gap being formed in the bonding material; and disposing a cover on the carrier structure, wherein the electronic element is covered by the cover, and the magnetic conductive member is positioned between the cover and the electronic element.

15. The method of claim 14, wherein the cover is an iron cover.

16. The method of claim 14, wherein the cover comprises a sheet and supporting legs erected on the sheet, wherein the air gap is formed between the sheet and the magnetic conductive member, and the supporting legs are bonded onto the carrier structure.

17. The method of claim 14, wherein the magnetic conductive member is ferrite.

18. The method of claim 14, further comprising forming a surface treatment layer on the cover.

\* \* \* \* \*